(12) United States Patent
Jamar et al.

(10) Patent No.: US 8,873,024 B2
(45) Date of Patent: Oct. 28, 2014

(54) ILLUMINATION SYSTEM FOR USE IN A STEREOLITHOGRAPHY APPARATUS

(75) Inventors: Jacobus Hubertus Theodoor Jamar, Vessem (NL); Herman Hendrikus Maalderink, Nuenen (NL); Andries Rijfers, Kamerik (NL); Borgert Kruizinga, Zoetermeer (NL); Jentske D. Kooistra, Delft (NL)

(73) Assignee: Nederlandse Organisatie voor toegepast-natuurwetenschappelijk Onderzoek TNO, Delft (NL)

( * ) Notice: Subject to any disclaimer, the term of this patent is extended or adjusted under 35 U.S.C. 154(b) by 457 days.

(21) Appl. No.: 13/254,567

(22) PCT Filed: Mar. 8, 2010

(86) PCT No.: PCT/NL2010/050115
§ 371 (c)(1),
(2), (4) Date: Nov. 17, 2011

(87) PCT Pub. No.: WO2010/101465
PCT Pub. Date: Sep. 10, 2010

(65) Prior Publication Data
US 2012/0063131 A1 Mar. 15, 2012

(30) Foreign Application Priority Data
Mar. 6, 2009 (EP) .................................... 09154568

(51) Int. Cl.
*G03B 27/54* (2006.01)
*B29C 67/00* (2006.01)
*G03F 7/20* (2006.01)

(52) U.S. Cl.
CPC ........ *G03F 7/70416* (2013.01); *B29C 67/0085* (2013.01); *B29C 67/0066* (2013.01); *G03F 7/70391* (2013.01)
USPC .......................................................... 355/67

(58) Field of Classification Search
CPC .......... G29C 67/0066; G29C 67/0062; G29C 67/0085; G03F 7/70391; G03F 7/70416
USPC ................................................ 355/53, 67, 71
See application file for complete search history.

(56) References Cited

U.S. PATENT DOCUMENTS 5,084,714 A    1/1992   Beaman
5,274,732 A   12/1993   Farnand
(Continued)

FOREIGN PATENT DOCUMENTS

EP          0958912 B1    3/2003
EP          1480080 A1   11/2004
JP       2004-148698    5/2004
(Continued)

OTHER PUBLICATIONS

International Search Report for corresponding International Patent Application No. NL2010/050115 mailed Jul. 8, 2010.

*Primary Examiner* — Hung Herny Nguyen
(74) *Attorney, Agent, or Firm* — Swanson & Bratschun, L.L.C.

(57) ABSTRACT

The invention concerns an illumination system for use in a stereolithography apparatus, comprising a planar support supporting a two-dimensional array of individually controllable wide-angle light-emitting diodes (LEDs); and a multi-lens projector array arranged relative to the array, and adapted to project a focused image of the LEDs onto a work area. The multilens projector array is arranged to project light from the LED array having a light emitting edge area image spot size which is smaller than or equal to a light emitting central area image spot size.

18 Claims, 11 Drawing Sheets

(56) References Cited

U.S. PATENT DOCUMENTS

| | | |
|---|---|---|
| 6,391,245 B1 | 5/2002 | Smith |
| 8,142,179 B2 * | 3/2012 | Kihara et al. ............. 425/375 |
| 2002/0164069 A1 | 11/2002 | Nagano |
| 2003/0082487 A1 | 5/2003 | Burgess |
| 2005/0200820 A1 | 9/2005 | Gui |
| 2006/0023192 A1 | 2/2006 | Gui |
| 2006/0098175 A1 | 5/2006 | De Jager |
| 2009/0002669 A1 * | 1/2009 | Liu et al. ................. 355/67 |
| 2010/0331929 A1 * | 12/2010 | Burrows et al. ........... 607/88 |
| 2012/0057143 A1 * | 3/2012 | Jamar et al. ............. 355/67 |

FOREIGN PATENT DOCUMENTS

| | | |
|---|---|---|
| JP | 2005-193638 | 7/2005 |
| TW | 200625027 | 7/2006 |
| WO | WO 2004/013692 | 2/2004 |
| WO | WO 2004/096527 | 11/2004 |
| WO | WO 2006/064363 | 6/2006 |
| WO | WO 2006/074812 | 7/2006 |
| WO | WO 2008/118263 | 10/2008 |

* cited by examiner

ILLUMINATION SYSTEM FOR USE IN A STEREOLITHOGRAPHY APPARATUS

RELATED APPLICATIONS

This application is a 35 U.S.C. §371 national phase application of PCT/NL2010/050115 (WO 2010/101465), filed on Mar. 8, 2010, entitled "Illumination System for Use in a Stereolithography Apparatus", which application claims priority to European Application No. 09154568.1, filed Mar. 6, 2009, which is incorporated herein by reference in its entirety.

The invention relates to the field of stereolithography, and more in particular to an illumination system for use in a stereolithography apparatus.

Stereolithography, also known as 3D-printing, is a rapid prototyping technology for producing parts with high accuracy. In a simple implementation stereolithography may utilize a vat of liquid light-curable photopolymer resin and a computer controlled UV-laser to cure the resin, one layer at a time. The construction process is essentially cyclic. For each layer that corresponds to a slice of the part to be produced, the spot of the laser beam traces the respective cross-sectional pattern on the surface of the liquid resin. Exposure to the laser light cures or solidifies the traced pattern, and adheres it to the layer below. Once a layer has been cured, the part in the making—which may rest on an elevator platform immersed in the vat of photopolymer resin—may be lowered by a single layer thickness such that its top layer is positioned just below the surface of the resin again, allowing the next layer to be built. This sequence of steps is continued until the part is finished.

Instead of with a laser, the stereolithography apparatus may be fitted with an illumination system comprising two dimensional arrays of LEDs and lenses to provide for selective illumination of the photopolymer resin. The illumination system as a whole may be moveably disposed relative to the location of the workpiece, while the LED's may be rigidly connected to one another and the lenses. The lenses may serve to image the light-emitting surfaces of the LEDs onto the surface of the photopolymer resin. Preferably, each LED is associated with its own conjugate image spot, such that an array comprising a certain number of LEDs may produce just as many image spots. During production, the illumination system may be scanningly moved relative to the vat holding the photopolymer resin, while the individual LEDs may be selectively switched on and off so as to illuminate the surface of the resin according to the cross-sectional pattern of the layer to be solidified. Compared to a laser an illumination system based on LED lighting is relatively inexpensive. In addition, it offers an equally high or higher accuracy at greater production speeds.

To manufacture a suitable illumination system in an economical fashion is challenging. One of the challenges is lying in providing an optical system that transmits sufficient power. The higher the optical power that is transmitted by the system, the faster the stereolithographic process can be performed. However, given the wide-angle nature of LED's it is a challenge to couple the LED light into the optical system.

It is an object of the present invention to provide for an economical solution that overcomes or alleviates one or more of the above-described problems associated with the state of the art.

To this end, the invention provides an illumination system for use in a stereolithography apparatus. The illumination system comprises a planar support supporting a two dimensional array of individually controllable wide-angle light-emitting diodes (LEDs) and a multilens projector array arranged relative to the array, and adapted to project a focussed image of the LEDs onto a work area. Said multilens projector array has a light emitting edge area focus error which is smaller than a central area focus error.

Here the term "focus error" is used to indicate the size of the spot on the image plane formed by rays from a single point on the source. This is an "error" because ideally the spot on the image plane should be as small as the corresponding source point. Typically, the image defines a central axis and an image perimeter. In an embodiment the image edge area extends more than 80% away from the central axis relative to the image perimeter, and the central area extends less than 60% away from the central axis relative to the image perimeter. An edge area image spot size is defined as a spot size of a point on the edge area of a LED emitting area that is imaged on the work area. Conversely, a central area image spot size is defined as a spot size of a point in the central area of a LED emitting area that is imaged on the work area. We refer to FIG. 5 for a discussion of the terms central area and edge area.

As a synonym for "focus error" the term "image spot size" can be used or alternatively, mean width of a point spread function further clarified in FIG. 4.

Note that in a different sense the term "focus error" is sometimes used to define the distance between a focus plane and image plane, which is linearly related to the image spot size.

Another characterization is that the multilens projector array is arranged to project light from angles larger than a focused numerical aperture angle in a conventional optical design. Here, the focused numerical aperture angle is defined as the maximum entry angle of the outermost ray into the projection optical system that can be imaged in focus. More specifically, said multilens projector array is arranged to project light from the LED array emitted from angles larger than a maximum entry angle of an outermost ray entering the projector array that can be imaged in focus. Here the entry angle is measured relative to an optical axis or normal direction of the projector array. Thus, the "focused numerical aperture" value (FNA), is defined as $n*\sin(\text{thetaf})$ where thetaf is the angle of the outermost ray that is well focused by the system. One further definition of focus may be that a ray is imaged within approximately 5 um, preferably within approximately 2 um from the image of a central ray.

Normally, in a design of an optical system the maximum entry angle is chosen to be not larger than the focused numerical aperture. A well-known characterization of a numerical aperture is $NA = n \sin \theta$ wherein $\theta$ defines a maximum entry angle of light into the projector system (irrespective of its focussing behaviour); and n is the refractive index of the projector. A typical numerical aperture value of a projector system is 0.2. In one characterization, the numerical aperture of the projector system according to an aspect of the invention is at least approximately 0.3—to values ranging to 0.8 or even above 0.8.

The solution offered by the present invention is based on the understanding that depending on the lens design, one can distinguish a FNA value for points in the central area of the emitting surface and for points in the edge area of the emitting surface. The inventors found, that for the effective total spot quality, the FNA of the edge area points is most important, and that the optical design of the lens system can be made or changed to provide large FNA for edge area points while allowing the FNA for central area points to be reduced.

Accordingly, the multilens projector array utilizes a larger numerical aperture than would be conventionally feasible, in particular, with a lens arrangement of no more than two lens stacks, by relaxing the focussing quality of the projector array in a specific way. This is preferably obtained by designing the optical surfaces such, that the image quality is only corrected at the outer edges of the LED image in the resin. According to one characterization, the focusing quality of the outer edge parts of the LED image is at least equal or even better than the focusing quality of the central parts. As an example, in a typical projector setup, a central point of the LED may be imaged in a region of about 30 micron diameter, for example, in a region extending between 25 and 40 micron; wherein a peripheral point of the LED may be imaged in a region of about 20 micron diameter, for example, in a region extending between 10 and 25 micron; illustrating a focusing quality of the edges which is about a factor 1.5 better than the focussing quality in the central parts. Typically, the focusing quality of the edge areas is at least equal to the focusing quality of the central area. Furthermore, the image quality criterion used may be more relaxed than conventionally expected, because advantage is taken from the thresholding behaviour of the resin.

According to a further elaboration of the invention, the multilens projector array comprises an array of lenslets aligned with the array of LEDs; the multilens projector array further comprising an optical mask, disposed in between the LEDs and the work area, and having transparent parts that are arranged in correspondence with an arrangement of the LEDs in the two dimensional array, the transparent parts defining an aperture stop allowing entry of light emitted from angles larger than a maximum entry angle of an outermost ray entering the projector array that can be imaged in focus.

In this embodiment, the aperture of the lens system is provided by an aperture stop in the mask. This aperture stop may thus define an opening that is larger than would be provided by the FNA in a conventional optical design. The optical mask is disposed at a position between the light-emitting surfaces of the LEDs and the imaging system.

Although the optical mask may be disposed at different positions in the illumination system, as will be elucidated below, the optical mask is preferably disposed in a Fourier plane. At such a position the mask may prevent any undesired light from entering the imaging system, in which it might disperse, making it harder to eliminate at a later stage. For a given optical mask and LED array, a suitable position between the light-emitting surfaces of the LEDs and the image plane should therefore allow the mask to serve as an aperture stop, or in fact a plurality of aperture stops, one for each light-emitting surface. Particularly advantageous is the application of an optical mask to a light-receiving face, in particular a plano face, of a multi-lens array that is part of the imaging system. The optical mask may for example take the form of a film or a coating. A plano side allows the optical mask to be applied easily, whereas application to the multi-lens array does away with the necessity to align a separate optical mask relative to the multi-lens array during assembly of the illumination system. The above-mentioned and other features and advantages of the invention will be more fully understood from the following detailed description of certain embodiments of the invention, taken together with the accompanying drawings that are meant to illustrate and not to limit the invention.

A known illumination system is the one described in WO2006/064363 where the light of multiple light sources (LEDs) is collimated by a multi lens array to provide an essentially uniform illumination on a substrate. The outgoing beams are slightly diverging, so that the outgoing beams have a certain overlap on the substrate. A film mask is provided on top of the substrate for patterning purposes.

A similar illumination system is known from US2009/0002669A1.

Figure 1:
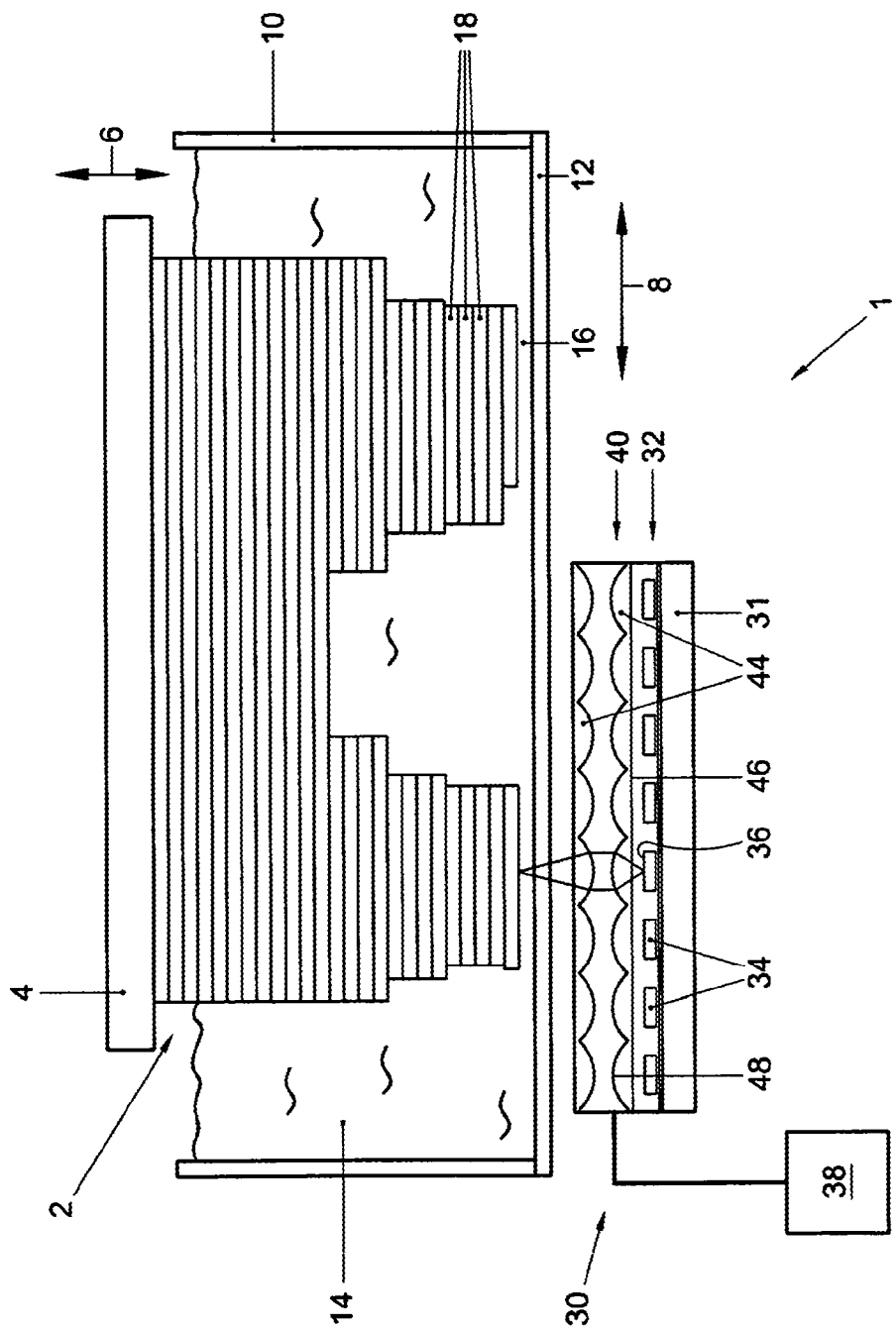
FIG. 1 is a schematic sectional view of an exemplary stereolithography apparatus in which the illumination system according to the present invention may be used.

In the drawings, identical reference numbers identify similar elements. The sizes, shapes, relative positions and angles of elements in the drawings are not necessarily drawn to scale, and some of these elements may be arbitrarily enlarged and positioned to improve drawing legibility. Further, the particular shapes of the elements as drawn are not intended to convey any information regarding the actual shape of the particular elements, and may have been solely selected for ease of recognition in the drawings.

DETAILED DESCRIPTION

Reference is first made to FIG. 1, which shows a sectional side view of an exemplary stereolithography apparatus 1. The apparatus 1 may be used for the layerwise production of a tangible object 2, such as a prototype or model of an article of manufacture. The apparatus 1 comprises a carrier plate 4, a liquid reservoir 10, and an illumination system 30.

During production, the tangible object 2 is suspended from the carrier plate 4 to which the first-constructed layer of the object 2, and indirectly also any subsequent layers, adhere. The carrier plate 4 is moveable in a direction 6 by means of a drive mechanism (not shown), and is moved upward one layer thickness each time a new layer has been constructed.

The liquid reservoir 10 is filled with a liquid, photo-curable resin 14. A bottom plate 12 of the liquid reservoir 10 is optically transparent to the light emitted by the illumination system 30, which is to be described hereafter. The bottom plate 12 also functions as a construction shape that bounds one side of a liquid layer 16 to be (partially) solidified. It will be clear that once a layer has been constructed, and the carrier plate 4 is moved upward one layer thickness, the space between the lastly constructed layer and the bottom plate 12 is filled with resin 14, so as to form said liquid layer 16.

The apparatus 1 also comprises an illumination system 30 that is adapted to selectively illuminate a predetermined area of the liquid layer 16. As a result of the illumination, a solid layer 18 of the tangible object 2 may be obtained, said layer 18 having a predetermined shape in accordance with the applied illumination pattern. The illumination system 30 includes an LED array 32 provided on a support 31 and an imaging system that comprises a multi-lens projector 40. In other embodiments, the imaging system may comprise a different number of multi-lens arrays, for example just one, and/or other elements, depending on the desired configuration.

The LED array 32 comprises a plurality of LEDs 34. The LEDs 34 are arranged in a two dimensional plane, preferably in a grid-like fashion, such that the LEDs compose equidistant and perpendicularly oriented rows and columns with each LED defining a gridpoint. Each of the LEDs 34 possesses a light-emitting surface 36 that faces the bottom plate 12 of the liquid reservoir 10, which is substantially parallel to the two dimensional plane of the LED array 32. A controller 38 may be provided to control, i.e. switch off and on (with desired intensity), individual LEDs 34 in the array 32 so as to create a time-varying two dimensional pattern of lighted LEDs that may be projected onto the liquid resin layer 16.

The substantially planar multi-lens projector 40 is disposed in between the light-emitting surfaces 36 of the LEDs 34 and the liquid layer 16 to be selectively cured. The projector 40 comprises a plurality of lenses 44, preferably one for each LED 34. The lenses 44 may preferably be arranged in correspondence with the arrangement of the LEDs 34 in the array 32. The multi-lens projector 40 may be of a plano-convex type, thus having one plano side 46 that defines the plano side of all lenses 44, and a plurality of convex, partially spheroidally shaped sections 48, one for each lens 44. The lenslets 44 may be oppositely oriented, as shown in FIG. 1. Together, the multi-lens projector 40 forms an imaging system that is adapted to image a pattern of lighted LEDs onto the liquid layer 16 in such a way, that each lighted LED 34 produces a separate, conjugate spot on a predetermined area of the liquid layer 16. The multi-lens projector 40 may be made of a variety of materials, including glass and plastic.

The illumination system 30 may be moveably disposed below the bottom plate 12 of the liquid reservoir 10, such that it can move in a direction 8 parallel to the bottom plate 12 of the liquid reservoir 10. The motion of the illumination system 30 may be controlled by the aforementioned controller 38, which also controls the lighting of the LEDs 34. In use, the illumination system 30 may be moved rectilinearly in a direction that extends at an angle with the perpendicular directions of the rows and columns of the LED array 32 to enhance the effective resolution of the system. This technique is described in more detail in copending application EP 07150447.6 in the name of applicant, which is incorporated herein by reference for further information regarding this aspect. Accordingly, in FIG. 1, an illumination system 30 for use in a stereolithography apparatus 1 is shown, comprising: a planar support 31 supporting a two dimensional array of individually controllable wide-angle light-emitting diodes (LEDs) 34 comprising light emitting surfaces; and a multilens projector array 40 arranged relative to the array, and adapted to project the light-emitting surfaces of the LEDs onto a work area 16. The light emitting surfaces may be defined by a LED-substrate surface or, equivalently, a planar mask placed adjacent to the LED-substrate, so that a focussed image of the LEDS is provided onto the work area 16.

A typical width dimension of the Led array and multilens array is 50×5 cm, to be able to project a scan image on a work area of 500×500 mm. However, the invention is not limited to such dimensions. Other typical numbers are a projector pixel number of 10.000 to 25.000 or more pixels placed in a grid distance of 2 mm and slightly placed under an angle to form a resolution of 20 micrometer. (curing layer thicknesses of typically 50 micrometer). Attainable production speeds of tangible objects 2 could be typically 20 millimeters per hour or more.

The light is typically UV light in a 300 nm area, in particular, in a 300-400 nm range.

According to an aspect of the invention, the multilens projector array 40 wherein said multilens projector array is arranged to project light from the LED array having a light emitting edge area focus error 240 which is smaller than or equal to a light emitting central area focus error 241.

Typical values of the edge area focus error 240 may range from 15-25 micron; typical values of the central area focus error 241 may range from 0-30 micron. This is schematically illustrated in FIG. 2 and further elaborated in FIG. 4 and FIG. 5.

Accordingly, in the edge area, typically defined as the outer area of the image of ranging between 80-100% from the image axis relative to an image perimeter, it can be seen that points on the edge area of a LED emitting area are focussed with a spot size that is e.g. at least 1.5 times smaller than the spot size with which points in the central area of a LED emitting area are focused.

Figure 2:
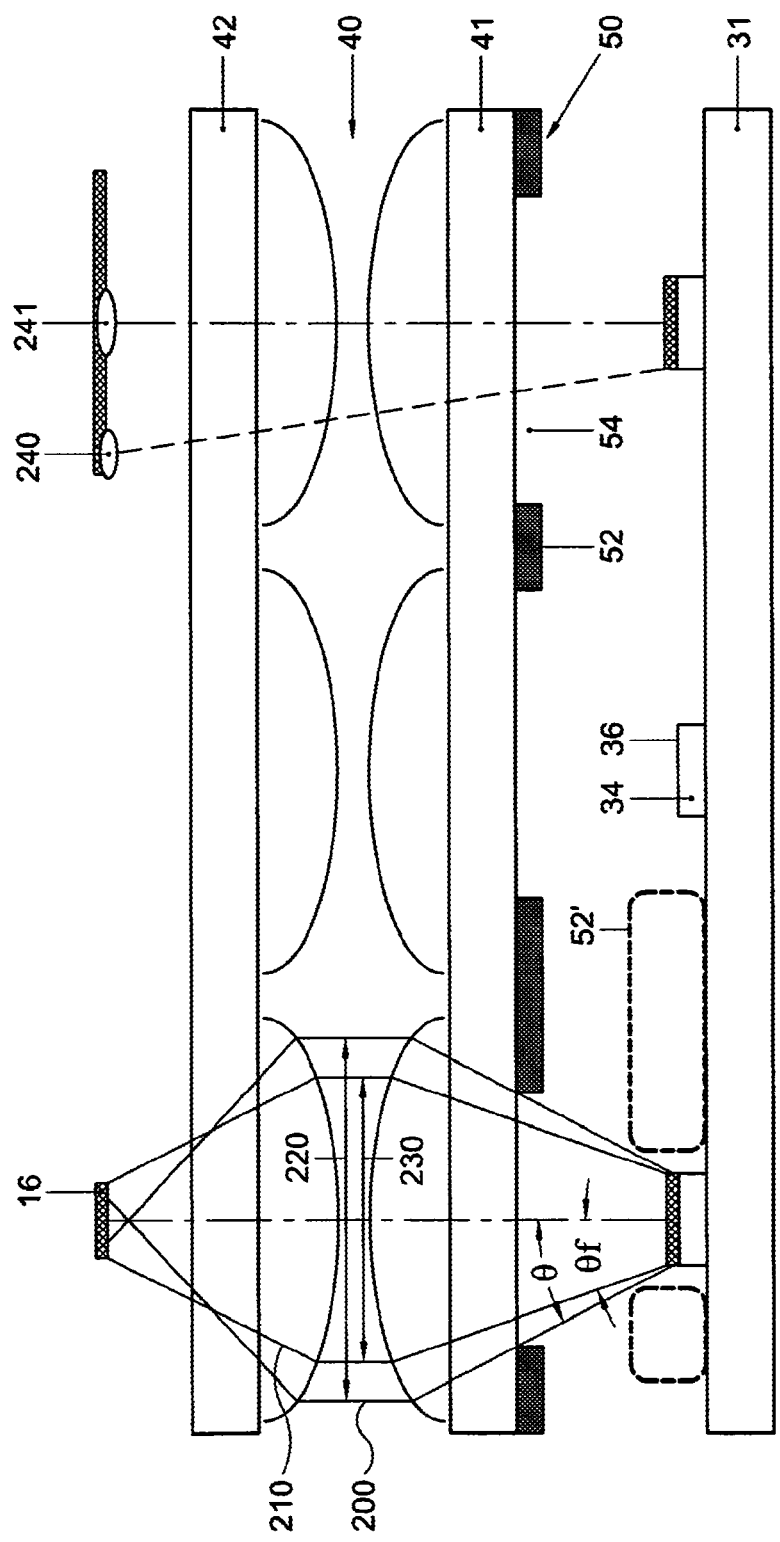
FIG. 2 shows a schematic ray tracing diagram illustrating inventive aspects of the invention.

Illustrative of an alternative aspect, FIG. 2 depicts the outer rays (marginal rays) 200 of the cone defining a maximum light-receiving cone. However, only a limited part 210 of the cone may be imaged correctly, outside this cone, due to aberrations, the lens system may be unable to generate a correct image. This limited aperture 230 is indicated as the multilens projector focused numerical aperture having an entry angle $\theta f$ of around 17 degrees measured relative to a projector optical axis.

The following table gives exemplary numbers:

| Focused NA | angle ($\theta f$; degrees) | f/number |
|---|---|---|
| 0.24 | 14 | f/2 |
| 0.3 | 17.5 | f/1.6 |
| 0.45 | 26.7 | f/1 |
| 0.8 | 53 | f/0.3 |

According to an additional aspect of the invention however, the aperture 220 of the projector is defined in such a way that said multilens projector array is arranged to project light from the LED array emitted from angles larger than would be provided by the FNA in a conventional optical design. These larger angles are indicated in FIG. 2 by the cone 200. It is noted that by these increased aperture angles, the multilens projector array optical power transmission can be increased more than 5%; typically even more than 10% or even more than 50%, of a maximum multilens projector array power transmission defined by the multilens projector array focused numerical aperture. Indeed, increase of optical transmission power is directly effective for the scanning speed. For example, a LED having a total output of 250 mW will transmit about 20 mW in a projector having a focused numerical aperture of 0.3 (equivalent to about 0.25 sterad). Transmitting the light using a numerical aperture of 0.8 will increase the optical power transmittance substantially to about 50% or more of the LED emitted power.

Thus, by relaxing the focussing constraint for image spots in a central imaging area, advantage can be taken from LEDs which typically provide a high output power for a given cost (high output/cost ratio), but which have a light emission pattern that is relatively wide for conventional optical systems. Generally, it is therefore difficult to transmit the output power efficiently to the plane where it is needed (the resin plane), and at the same time concentrating the power in a small spot (to get high resolution).

The high output angle of the LED means the input side of the optics must have a large acceptance angle, i.e. a high numerical aperture on the input side of the optics.

In optical design, with increasing NA it becomes increasingly difficult to achieve a good quality image. For this reason conventional optics normally have NA of 0.2-0.3 or even below 0.2. In special applications, e.g. wafer scanners, a NA of e.g. 0.65 may be used, but then the optics is enormously complex and expensive in order to achieve a usable image quality.

In our invention, we reduce the optic complexity at high NA by relaxing the imaging requirement: we no longer require (as in standard optical design) that each point of the LED surface is imaged accurately to a small image point in the image plane (resin layer). Instead we only require that the sum total of all the image points (images of all points on the LED emitting surface) has sufficient definition (sufficiently sharp edges) for use in the apparatus process.

For example, a square LED emitting surface of 100×100 um could be used, imaged with a magnification of around 1:1. The sum total of the imaged light distribution should then be an approximate square, with edges that can be allowed to have slopes of e.g. 50 um wide (distance between 10%-90% image intensity contours).

Under these requirements, a relatively simple and inexpensive optical system with e.g. NA=0.8 is feasible.

For the optical mask 50 to serve its above-described function, it may be disposed in between the light-emitting surfaces 36 of the LEDs 34 and the work area, i.e. the liquid layer 16 which is to be selectively cured. In general terms, the optical mask 50 includes a substantially opaque plane 52 wherein a plurality of transparent parts or holes 54 is provided. It is understood that the notions of opaqueness and transparency relate to the wavelength(s) of the light that is emitted by the LEDs 34 and that is suitable for solidifying the photo-curable resin 14. Typically, this is UV-light having a wavelength in the range 300-400 nm but light of different wavelengths may be used as well, subject of course to the availability of a properly responsive resin 14. The transparent parts 54 may preferably be arranged in alignment with the arrangement of the LEDs 34 in the array 32. They may further have any desirable shape, e.g. round or rectangular. In different embodiments of the invention, the optical mask 50 may take different forms and shapes. In addition, it may be disposed at different positions along the path of the light travelling form the LEDs 34 to the work area. As can be seen in FIG. 2, the mask 50 may be provided onto a plano side of the lenslet body 41, for example, as a separate platelike body 52 or by vapour deposition. Alternatively, as sketched by opaque bodies 52' the cone 200 can also be limited by a mask 52' arranged at a distance from the LEDs 34, but arranged on support 31. Although the inventive principle can be applied by a single multilens array, the projection quality can be improved by a stacked multilens array. Accordingly, in this embodiment the multilens projector array 40 comprises a plurality of lenslets 44 stacked along a multilens projector array optical axis. Furthermore the multilens projector array 40 comprises an array of lenslets 44 aligned with the array of LEDs 34; the multilens projector array 40 further comprising an optical mask 50, disposed in between the LEDs and the work area, and having transparent parts 54 that are arranged in correspondence with an arrangement of the LEDs in the two dimensional array, the transparent parts defining an aperture stop allowing entry of light emitted from angles larger than a maximum entry angle of an outermost ray entering the projector array that can be imaged in focus over the entire image profile width. From FIG. 2 it becomes clear that the multilens projector array entry angles of outermost rays that can be imaged in focus are defined by light cone 230, which is the maximum cone that is imaged correctly onto the working area 16. In preferred embodiments, typical numerical aperture values are larger than 0.3; in particular, these values may in addition be attained by aspherical lens surfaces. That is, the lenslets 44 may be aspherically shaped to increase a focused numerical aperture and/or to optimize an imaged spot, in particular, for the image edge areas.

Figure 3:
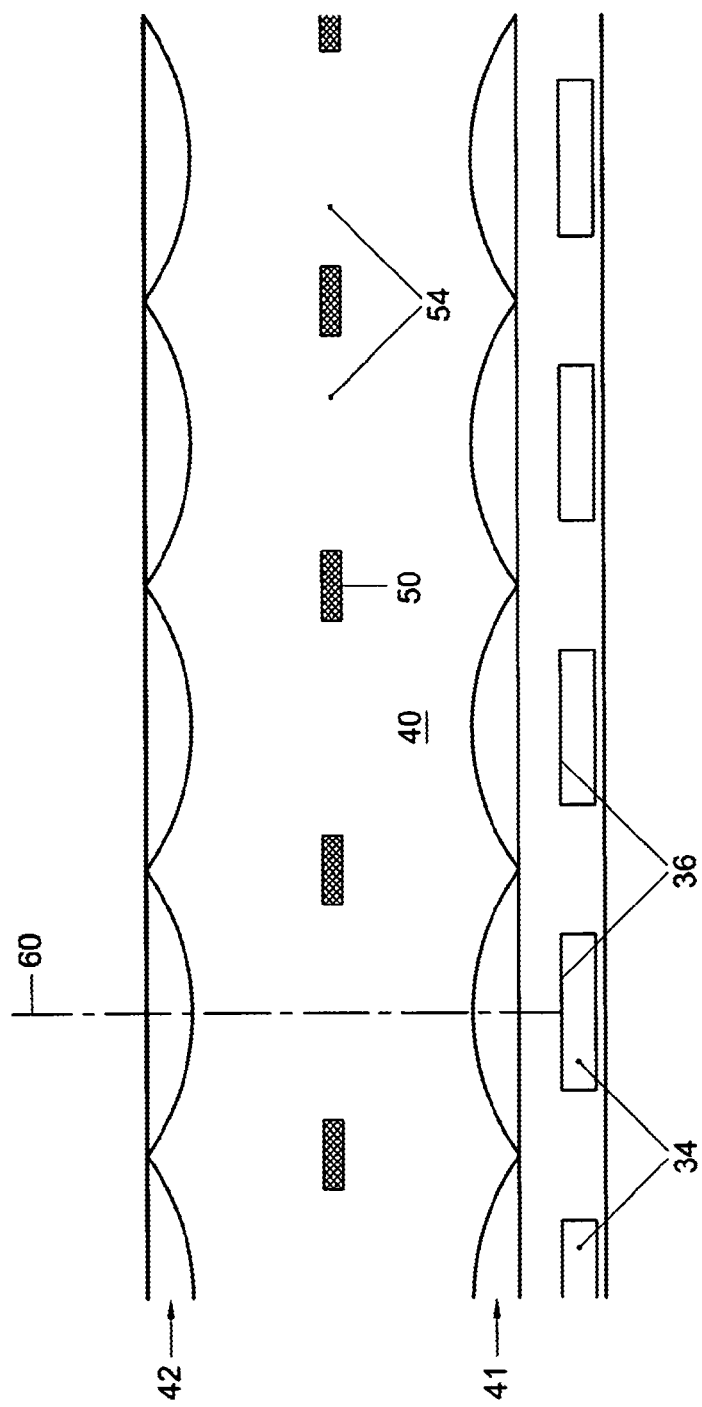
FIG. 3 illustrates a projector embodiment including a mask structure.

In the exemplary embodiment shown in FIG. 3, the optical mask 50 is provided in between the two multi-lens arrays 41, 42. Just like in the previous embodiment, the mask 50 essentially functions as an aperture stop that blocks light coming from angles of the light-emitting surface 36 of an LED 34 that are larger than the numerical aperture angle. Although in the FIG. 2 and FIG. 3 embodiments the optical mask 50 is structured as a separate plate-like object alternatively, the optical mask 50 may be provided by for example printing or vapour deposition.

Figure 4:
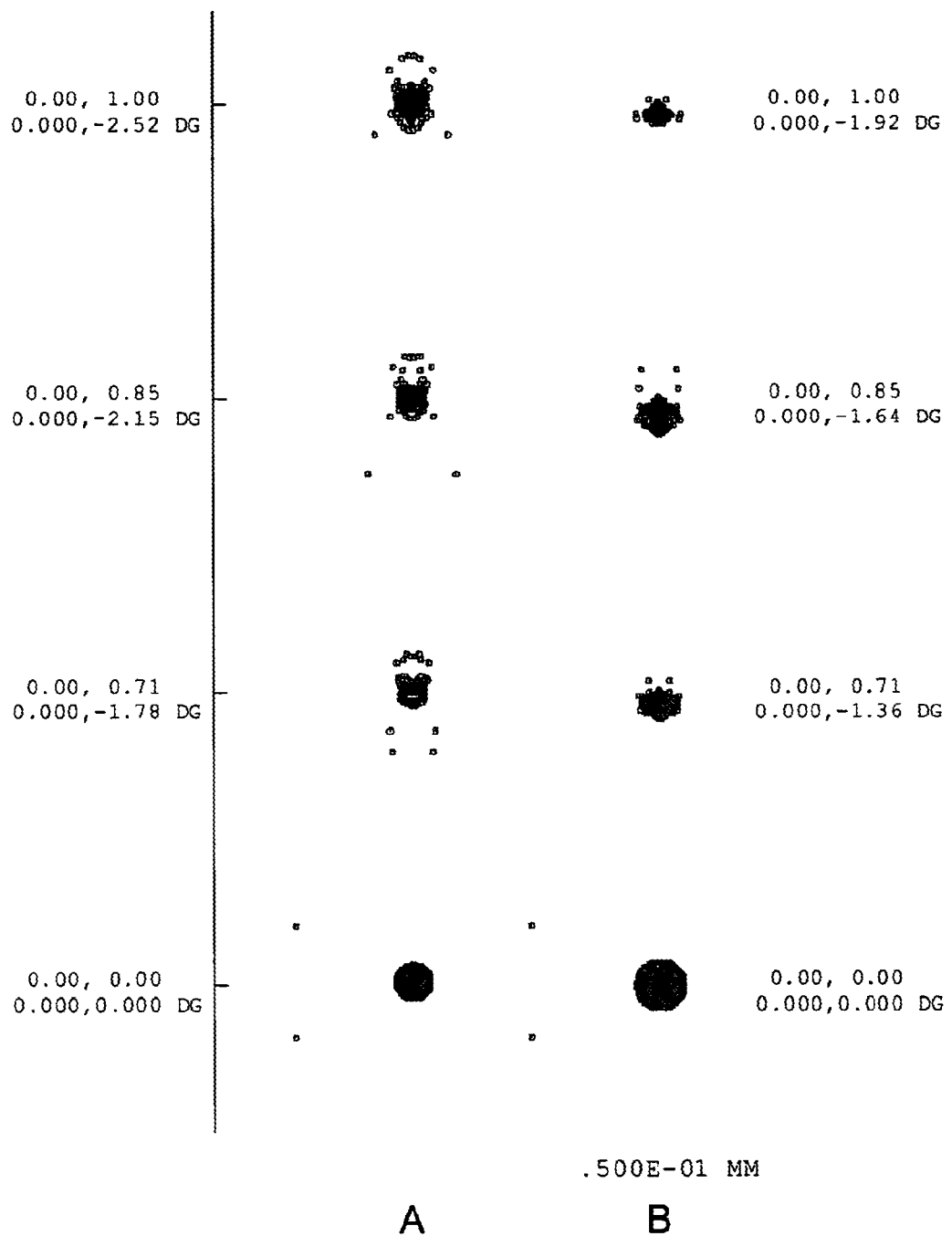
FIG. 4 shows focus error or spot size diagrams.

FIG. 4 shows focus error or spot size diagrams for spot sizes in a conventional design (FIG. 4A) versus spot sizes according to the novel design (FIG. 4B). From top to bottom an image spot distance relative to centre of light source is given as 100% (=outermost edge area image spot), 85%, 71%, 0% (central area image spot).

In a realistic lens design, a point on the light source is not imaged into a perfect point on the work surface. A source point is focused to a point-spot or image spot of a certain shape and size, larger than zero. There are limitations to the point-spot quality that are imposed by the laws of physics, the limited number of degrees of freedom in the optical design (for example the limited number of lens elements), and tolerances in manufacturing a given design. In optics, the resulting shape and size is known as the 'point spread function' (PSF) for the given source point, alternatively referred to as focus error or image spot size. The PSF at the image plane may be measured for example by recording the intensity distribution with the aid of a CCD-camera and a point source that can moved in the object plane, for example by placing an image sensor in the image plane and placing a mask at the LED's emitting area to mask all but a very small part (e.g. 2 um diameter) of the emitting area. The mask aperture is then a good approximation of a single source point.

For the sensor for example a CCD image sensor such as used in a CCD camera could be used. The image sensor should have sufficient resolution (small enough pixels, e.g. 4 um or smaller) to accurately resolve the shape of the PSF. The image sensor should also be calibrated so that the output signal for each pixel is a measure for the light intensity received by that pixel.

To characterize the PSF in terms of a single value, the spot width, e.g. the full width at half-maximum (FWHM) of the PSF may be used. The numbers for spot width mentioned in this application are to be understood as FWHM values of the PSF.

The essence of our invention is to choose the optical design predominantly for small mean width of the point spread function for points near the edge of the light source, which leads to a relatively small image spot size in the edge area, and letting the PSF for points nearer the centre of the source be worse, leading to a relatively large image spot in the central area.

Looking at FIG. 4B (right hand side) optimized according to the present invention, it is shown that the PSF for the centre spot is larger and therefore worse than a typical conventional design as shown in FIG. 4A (left hand side). However, surprisingly, this is not important for the shape of the total spot on the work surface, which is the sum of the PSF's of all the points on the light source. For the total spot to have a sharp edge, the PSF of the edge points are of dominant importance.

Accordingly the projector optics (imaging the emitting area of the LED onto the work surface) are optimized using a stronger weighting factor for the focus error in image points conjugated to object points near the edge of the LED emitting area, and a weaker weighting factor for the focus error in image points conjugated to object points near the centre of the LED emitting area, in the optimization that is used as a standard in the practice of designing optical systems. In an embodiment the weighting factor for the central area focus error is between 0% and approximately 50% of the weighting factor for the edge area focus error.

Commercially available programs as OSLO or Code-V or ZEMAX can be used for the purpose of lens design, wherein control parameters can be adjusted to direct the optimization toward the given specification, in particular a PSF that has a small width for points in the edge area, and a larger width for points in the central area. The control parameters may be e.g. a weighting function specifying the relative importance of residual design errors (==spot sizes) for different points on the light source area associated with a respective image spot size. Through software optimization the design parameters such as shape and position of optical surfaces can be determined.

Figure 5A:
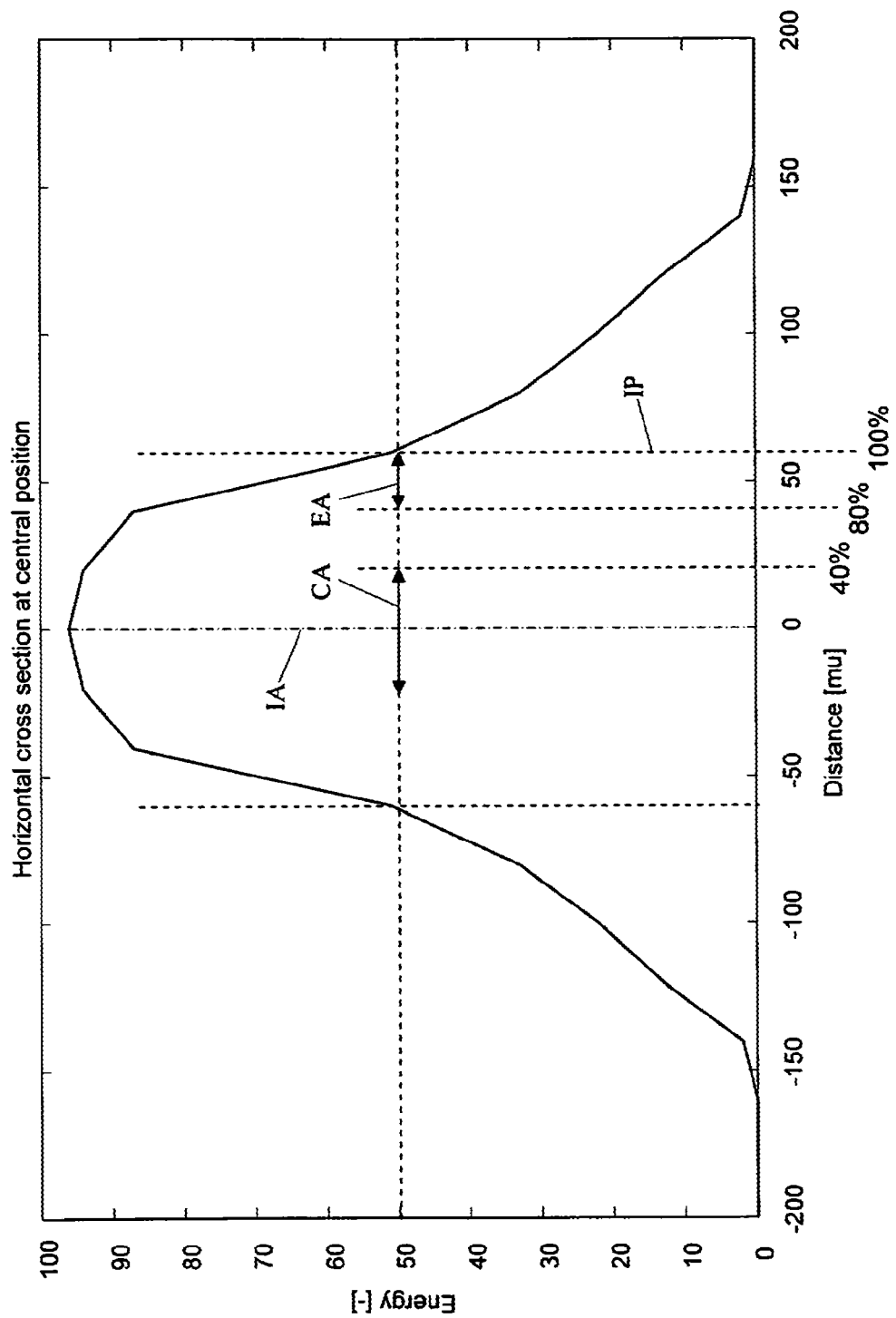
FIG. 5 shows a total image profile diagram.
Figure 5B:
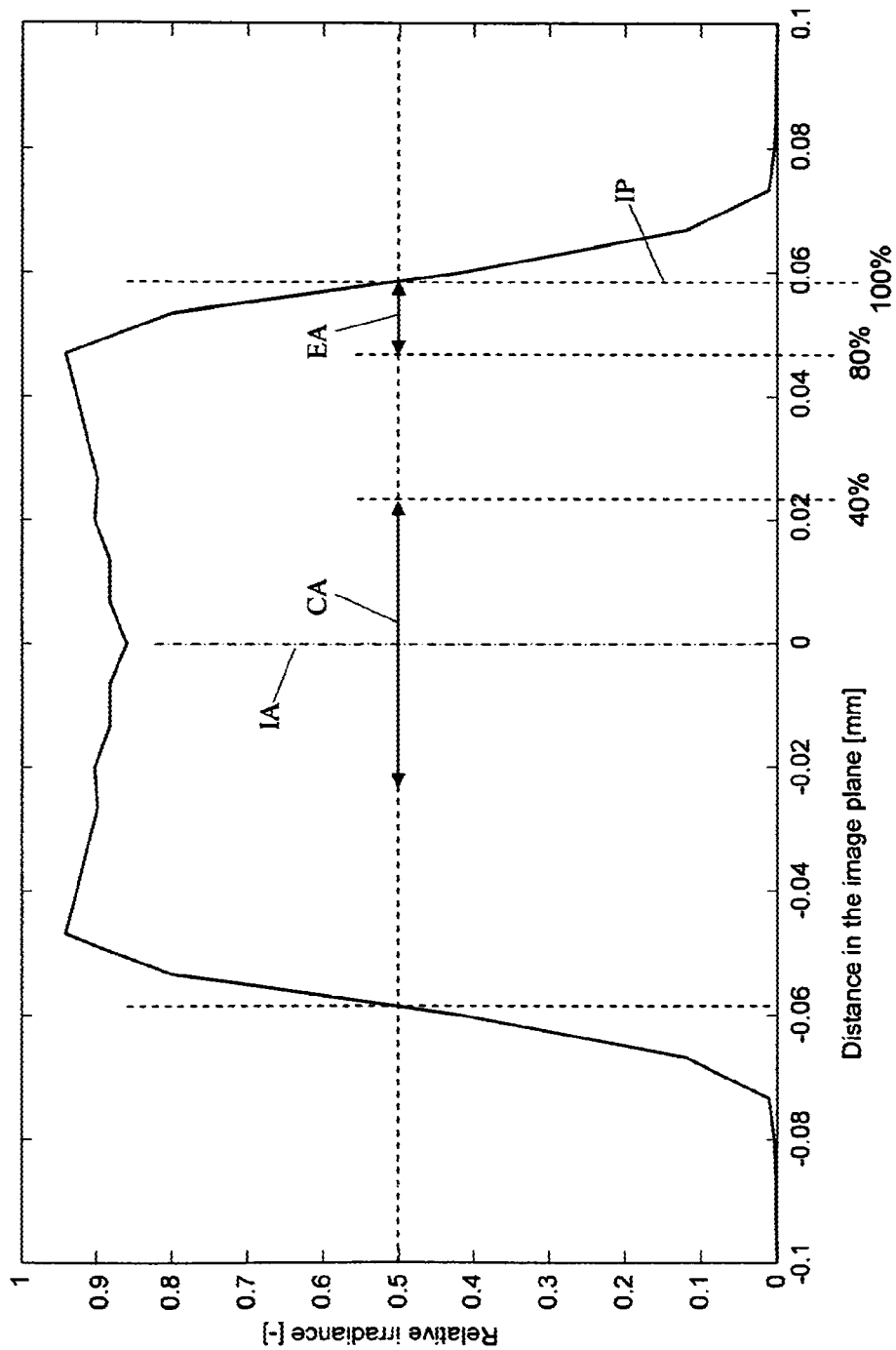

FIG. 5 shows a total image profile in a conventional optical design (FIG. 5A, top) and in an optical design according to the present invention (FIG. 5B, bottom), for a LED having a typical width of 100 um light emitting surface. Accordingly, an intensity—distance diagram is charted having an intensity profile over a certain distance ranging from central axis IA. The intensity is a relative intensity [a.u.] for both diagrams A and B.

In the figures, the image defines the central axis IA and an image perimeter IP. From the figure, it becomes apparent that an image perimeter can be defined as the perimeter where an intensity drops below a certain average intensity, for example, below 50% of a maximum intensity as indicated in the graphs.

By way of example the edge area EA extends more than 80%, for example 90% away from the central axis IA relative to the image perimeter IP, and wherein the central area CA extends less than 60%, for example less than 40% away from the central axis IA relative to the image perimeter IP.

Clearly, the total image profile in FIG. 5B is more sharply defined since it has steeper edges near the image perimeter than the image profile in FIG. 5B. The image profile width as measured at e.g. 50% of max. intensity is not much different (around 120 um in both cases), but in the case of the invention, the total light energy is much more concentrated within this width. The design as presently disclosed enables not only a sharper image profile but also enables a high acceptance angle (or high NA), which increases the optical power transmission. In an embodiment, accordingly, the central area focus error is more than 25 micron; and the edge area focus error is less than 25 micron. For example, the central area focus error may range between just above 25 micron to 40 micron; and wherein the edge area focus error ranges between 10 to just below 25 micron.

Conventionally, NA values of up to about 0.25 can be used. Beyond this, the advantage of higher light throughput no longer outweighs the decrease in spot quality. With our invention, NA values larger than 0.30 can be applied in a useful manner in many embodiments. Even NA values of larger than 0.5 or 0.6 can be usefully applied. In one practical design we applied an NA of 0.8.

For achieving a maximum light throughput, and a small image profile at the same time, preferably a magnification from LED light source to work surface is used of around 1:1. Other magnifications are possible but may result in a larger image profile or lower light throughput.

In an embodiment a projector array is arranged relative with an NA of 0.8 (acceptance angle 2×53.1°) for imaging a 100 um LED with a 1:1 magnification.

Exemplary aspects for a projector array having a larger magnification than 1:1 could involve increasing the NA (and light throughput) by placing the LED closer to the projector array, for example 10% closer. This would increase the tangent of the acceptance angle also by 10%, increasing the acceptance angle to 55.7°, and the NA to sin(55.7)=0.826 or 3.3%, and light throughput by 6.6%. However, the work surface 451 has to be placed farther away by about 10%, so the image size increases by 21%, and the image intensity decreases by about 27% (1.066/1.21^2=0.73). Thus, an image profile is enlarged 21% larger for only 6.6% gain in light throughput.

Conversely, in cases where small spot size is dominantly important, one could have a projector array having a smaller magnification than 1:1. This could involve increasing the distance from LED to the projector array, e.g. by 10% to decrease the image profile width. Acceptance angle is then 2×50.2, NA=0.77 (−4%), light throughput 92% (−8%). Image distance −10%, magnification 0.9×0.9=0.81 (−19%). Image intensity 0.921(0.81^2)=1.4 (+40%). However, in practice the image profile may remain somewhat larger, due to difficulty to keep the edge well focussed, and one has significant light throughput loss (8%) for only a little gain in spot size.

Figure 6:
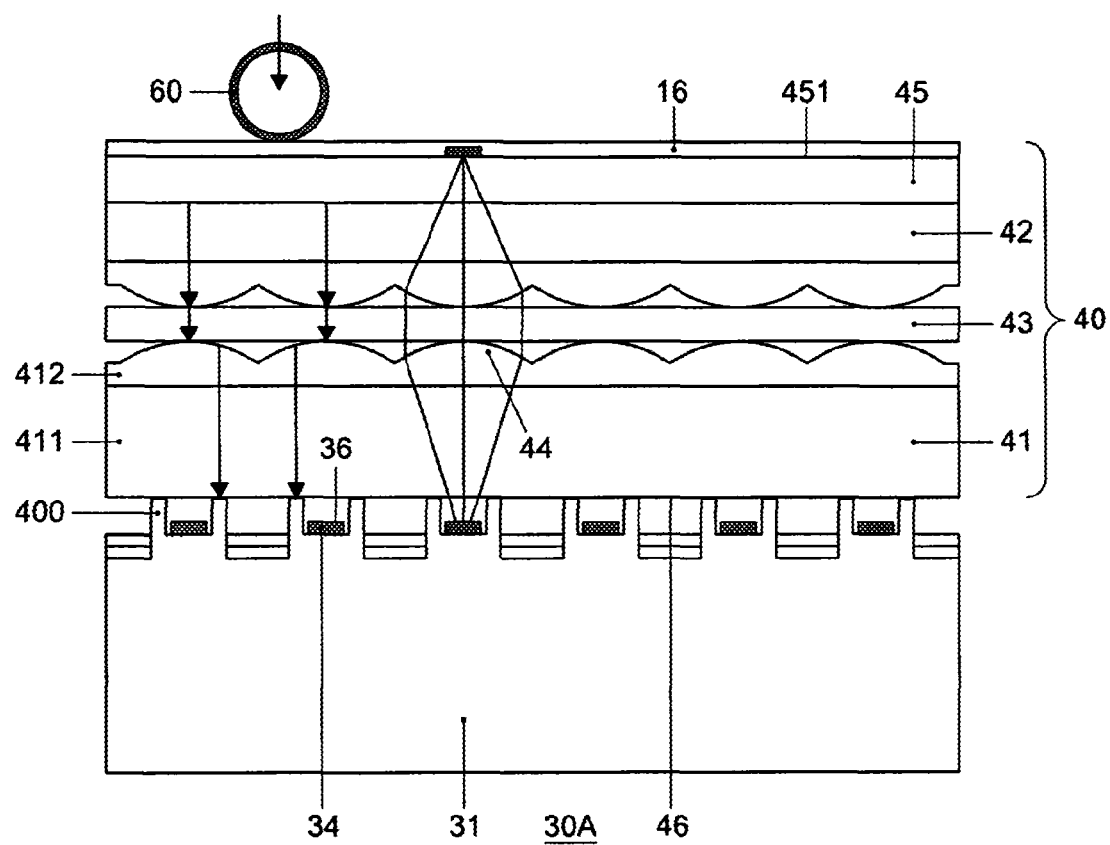
FIG. 6-FIG. 9 schematically illustrate certain embodiments of an illumination system according to the present invention.
Figure 7:
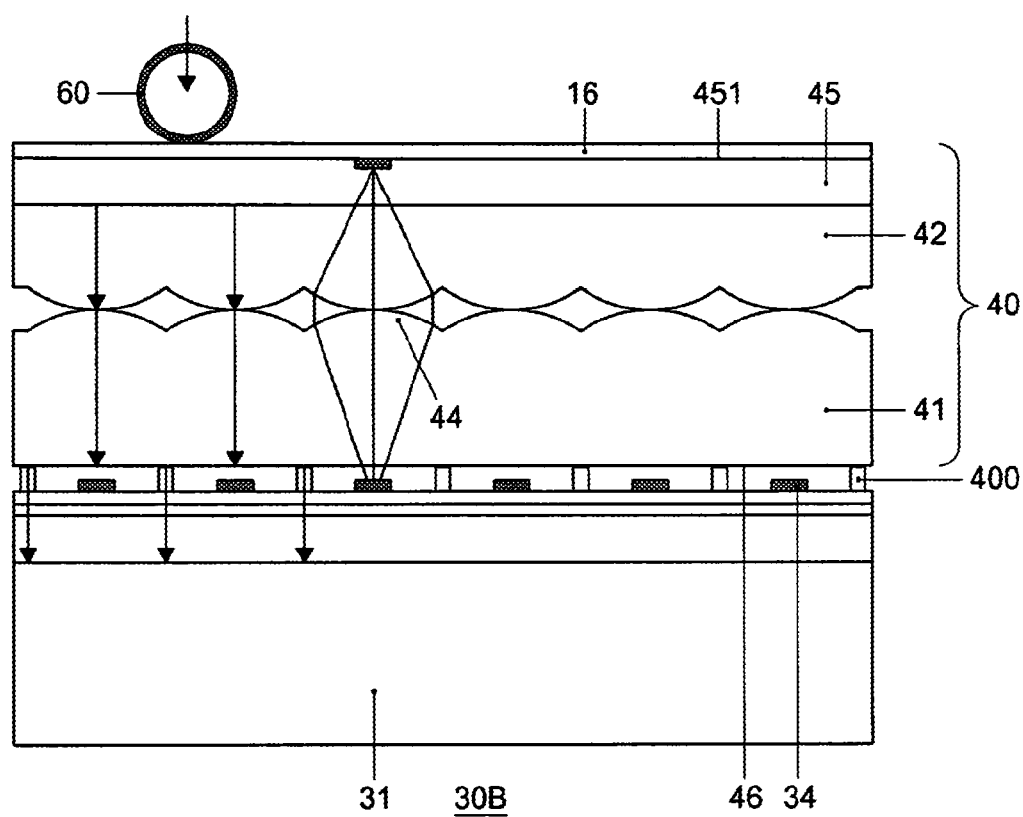

In FIG. 6 and FIG. 7, further detail is provided on some structural aspects of the illumination system 30. These embodiments show an illumination system 30 wherein the lenslets (44) are arranged in direct abutment on a lenslet convex side with another optical element (43) in the stack. In particular, multilens projector array (40) is formed by a stack of optical elements 41, 42, 43, 45, including a plurality of lenslets 44 in the form of a lenslet body 41, 42, in direct abutment on a lenslet convex side with another optical element 42, 43 in the stack.

Accordingly an illumination system 30 is provided for use in a stereolithography apparatus 1, comprising a planar support supporting a two-dimensional array 32 of individually controllable wide-angle light-emitting diodes (LEDs) 34; and a multilens projector array 40 arranged relative to the array, and adapted to project the LEDs onto a work area 16; wherein the multilens projector array 40 comprises a stack op optical elements including a plurality of lenslets in direct abutment on a lenslet convex side with at least another optical element in the stack.

In particular, in these embodiments the multilens projector array 40 comprises lenslet bodies 41, 42 each formed as a plano-convex multilens array; wherein at least one convex side of a lenslet body 41 or 42 is in direct abutment on contact zones arranged over substantially the entire body surface with another element of the stack (in FIG. 6: plano 43; in FIG. 7: lenslet body 42 arranged with opposed convex sides in direct abutment); the projector 40 thus forming an essentially rigid body supported by the planar support 31. In FIG. 6 spacers may be provided as protruding ridges 400 cast integral in support 31, and in direct contact with the plano side 46 of the lenslet body 41.

A difference between the two embodiments is the presence (FIG. 6) or absence (FIG. 7) of a plano body 43 between the two multilens arrays 41, 42. Both embodiments have the advantage that a rigid structure is provided that is easy to implement, and has high structural tolerance. In particular, the support 31 is a rigid support, for example, of an aluminium plate and comprises, for example further cooling structures such as coolant channels or heat fins to form a heat sink for the LEDS. By this structural assembly, forces exerted to the planar surface, for example, by a resin applying device 60 applying resin layer 16, can be led through to a rigid support 31.

Such a resin applying device 60 may be a resin foil guide, which is arranged to provide a resin foil in moving contact with the work area 16, which typically exerts a pressure onto the projector body 40 and which is addressed in order to enhance properly patterned illumination by the LED arrays 32. Pressing forces onto the projector 40 may be provided by a variety of other sources, including acceleration forces etc. An exemplary embodiment of such device 60 is disclosed the stereolithographic apparatus of FIG. 10.

Although in principle, optical arrangements demand strict dimensional tolerances; due to the nature of stereolithographic curing the imaged pixel area in the curing layer may not be identical to the imaged LED light emitting surface 36; which relaxes the constraint of in focus imaging. In particular, in an embodiment, the stacked lenslet bodies 41, 42 are formed with opposed convex sides in direct abutment on contact zones arranged over substantially the entire body surface; so as to form a flat rigid projector body 40. Here, remarkably, a slight flattening tolerance is allowed of the convex lenslets 44 that are in direct abutment, since only a very small portion of the imaged light is affected (slightly misfocussed) due to the flattening. E.g. a flattened portion of 0.15 mm diameter in a total effective lens diameter of 1.5 mm affects only about 1% of the total light transmitted. The flattening, due to shortening of the lenslet along the optical axis may be roughly one half of the LED light emitting surface diameter. This flattening may be predesigned to increase the geometrical stability of the projector body 40 and to ease the assembly of the lenslet bodies 41. In addition, the lenslets may be of a Fresnel type, wherein annular lens portions may be provided. The inner lens portion may be flat or at least flattened. Such lenslet arrangements may be used to further decrease a height dimension and/or stabilize the lens projector body 40.

FIG. 6 and FIG. 7 accordingly illustrate that the projector stack 40 is in direct abutment on contact zones arranged over substantially the entire surface with the projector support 31 of illumination system 30. Here, abutment over contact zones arranged over substantially the entire surface is meant to encompass configurations with isolated supports, such as depicted in the FIG. 6 and FIG. 7, as long as the sagging of the support is minimal in view of a pressing force exerted on the projector stack surface 451.

In an embodiment, typically a support point 400 may be provided per light channel, or one support point for every 2×2 light channels, or for every 5×5, 10×10 etc. light channels. In addition, the entire element surface may be strutted, for instance protective plate 45 is supported over its full area by lenslet body 42.

Accordingly each constituting element of illumination system 30A, 30B is supported by one of the lower elements in the stack, typically by a support structure immediately beneath the layer itself in direct abutment on at least one—for a structure supporting the entire surface, such as, in an embodiment, a transparent layer such as plano 46 or resin layer 33, see herebelow, or on many contact zones arranged over substantially the entire element surface.

The supports may be formed by bare LED dies 34. This may have an additional advantage of accurate Z-alignment of the dies by forming a flat levelling contact with the plano side of the projector stack 40.

In all, preferably the disclosed embodiments are formed by a rigid stack defining a compact and rigid illumination system 30A, 30B. The system 30 includes (from bottom to top) an electronics board 311 (printed circuit board, possibly flexible), optionally itself comprised of a number of layers of different materials and the projector 40 formed by a stack of optical elements. The mechanical link between the carrier 31 and the next higher layer may be e.g. a set of ribs 400 protruding upward from the carrier 31. Alternatively individual blocks (each having a flat top and bottom), or a plate with holes to leave space for the light sources (LEDs) may be provided (not shown).

The projector body 40 then is formed by a lower lens array 41, typically comprised of a plano side 46 formed by a transparent, e.g. glass plate 411, a layer 412 of lenslets 44, for example of a transparent plastic, and typically having a flat bottom side in contact with the glass plate 46 and on the top side a multitude of convex lens surfaces 44.

In an embodiment, a support plate 45, e.g. of glass material and a protection film (not shown) are provided typically defining a very short, almost zero working distance on working area 16. It is noted that this can be conveniently combined with the large NA working principle according to the invention demanding short, preferably (almost) zero working distances.

An advantage of the plano body 43 in FIG. 6 is that the X-Y alignment of the convex shaped lenslets bodies 41 42 is easier to control. In addition, a transparent top plano 45 may be attached to the multilens arrays to facilitate replacement of a work surface. While FIG. 6 shows spacers 400 as integrated elements of the support, a separate platelike structure could be provided as in FIG. 7. This structure could also serve as an aperture defining mask structure according to the inventive principle.

Figure 8:
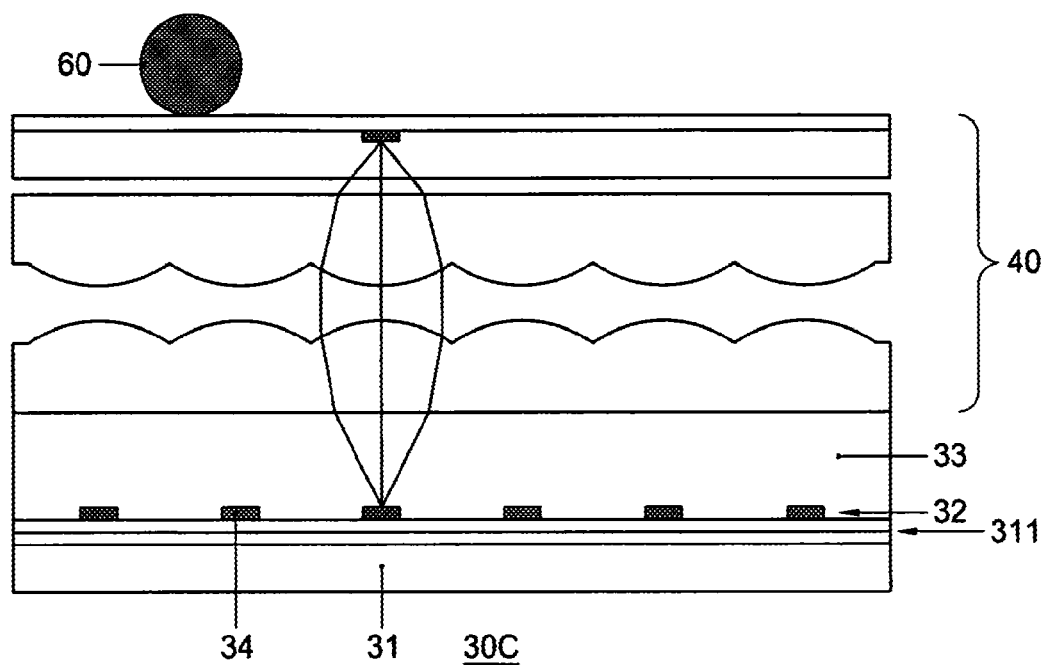

In another embodiment, illustrated in FIG. 8 alternatively, a resin layer 33 forming a reinforcement layer between the carrier 31 including the LED array 32, may be provided. The resin 33 may improve the structural stability and at the same time provide an optical transmission enhancement. Typically, the resin has a refractive index of around 1.3 or larger, for example, 1.5 and can be photo-curable silicon resin. While the resin may be of a curable type, additionally or alternatively, an optical transmission fluid may be provided, even in other parts of the stack, for example between lenslet arrays 41, 42, to improve the optical transmission and further improve the structural stability of the stack. This can for example be done by stacking, sealing and filling the stack with optical transmission fluid of a desired refractive index, and possibly curing the fluid. The LED material is typically a AlGaN having a refractive index of around 2.5. To optimize the transmission the resin does not have to be a continuous layer but may be applied in blobs, as long as each LED is covered, and the space between the LED and the optical part above it is filled. Suitable resin materials are transparent for the radiation used, which in an embodiment may be UV radiation around 365 nm. The material preferably has a refractive index higher than 1.3 which provides optical design latitude, in practice a value between the refractive index of the LED material and the refractive index of the plano 46. In a practical embodiment, a resin commercially obtainable under the tradename Sylgard 184 with refractive index n=about 1.55 was used. Other material choices may be for example acrylate, polycarbonate. Without said optical immersion of the resin layer 33, transmission losses may involve about 22%, where the addition of the resin layer may improve the transmission to a loss of only about 7%. Accordingly, an optical power transmission improvement of about 20% can be provided. Conveniently, the resin is of a photo-curable type, which can be cured by use of LEDS 34. In an embodiment, additionally, rigid spacers (not shown) are provided in the curable resin to improve the structural stability. The spacers may be removed after curing. Alternatively, the spacers are formed by the LED surfaces where only a thin film of resin may form a power transmission interface. Conveniently, the resin protects the mechanical integrity of the LED-bondings, in particular, the electrical circuit bonds.

Figure 9A:
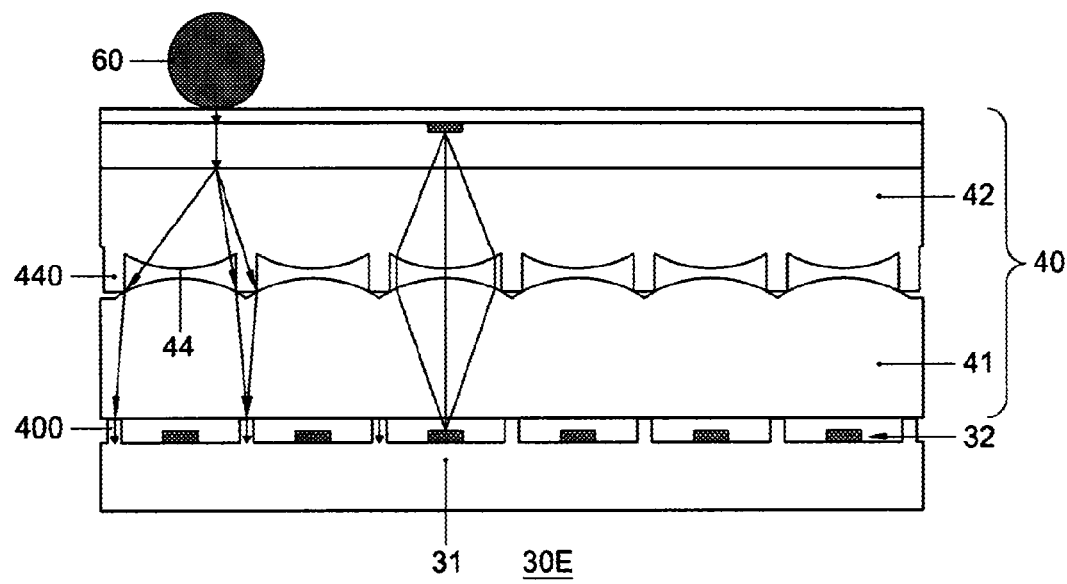
Figure 9B:
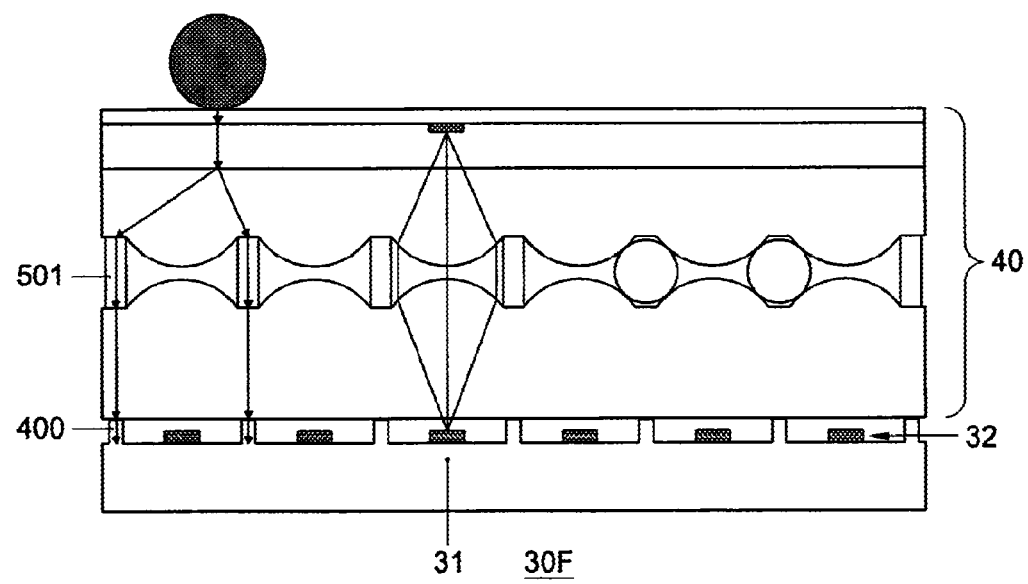

In another embodiment 30E, illustrated in FIG. 9A, supports can be embodied as protrusions 440 moulded on concave sides between the convex optical surfaces 44 of lens layer 42 or as an intermediate supporting layer 501 in illumation system 30F (FIG. 9B). Alternatively the supporting layer may be formed by a number of isolated supports, e.g. balls, but preferably, the layer is formed by an integral perforated plate 501 formed with perforations for the optical paths. Conveniently, anti-straylight mask 50 of FIG. 3 can be used for such purpose.

The orientation of the illumination device 30 may well be inversed to have the LEDs arranged on a top plano surface and a working area arranged on a bottom side.

Figure 10:
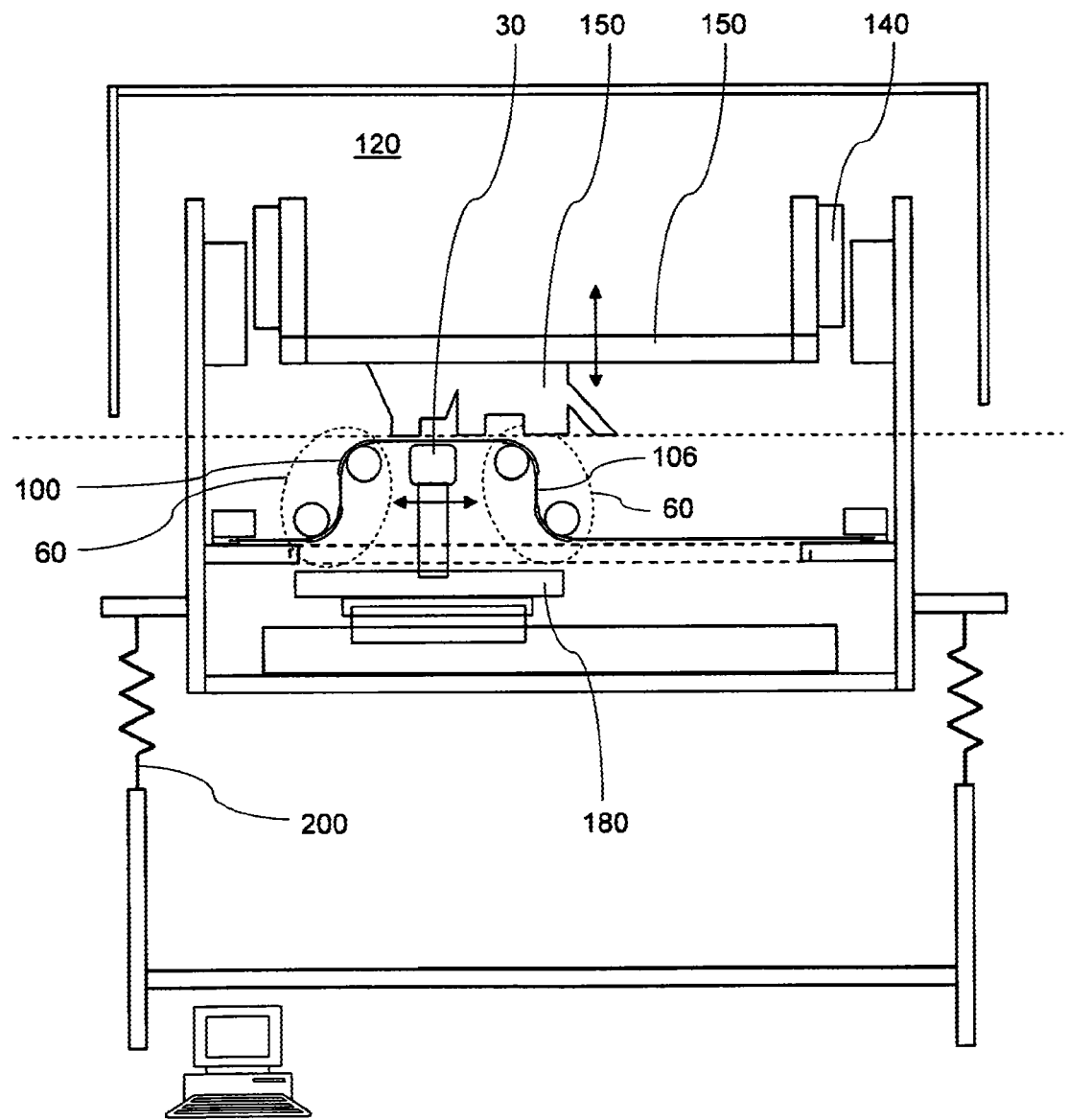
FIG. 10 shows another embodiment of a stereolithography apparatus.

FIG. 10 shows a further embodiment of a resin applying device 60 arranged to provide a resin foil in moving contact with the work area 16, which typically exerts a pressure onto the projector body 40 and which is addressed in order to enhance properly patterned illumination by the LED arrays 32.

The system 120 is disclosed in application PCT/NL2009/050783, which is incorporated by reference herein, comprises a construction shape in the form of a flexible foil 106. On the foil 106, a liquid layer 100 is formed of limited height to be brought in contact with the tangible object 150. The presently disclosed illuminator embodiments 30 are arranged, by suitable control of the LED array, to solidifying a predetermined area of a layer of the liquid 100, said liquid layer 100 adjoining the foil 106, so as to obtain a solid layer of the tangible object 150, the solid layer thus having a predetermined shape.

To enable the light or other radiation of the illuminator 39 to solidify the liquid layer 100, the flexible foil 106 is preferably substantially transparent to the radiation at least having film 106 clear on only one side and optionally matte on another side.

In the embodiment a movable foil guiding stage 180 is located below the construction shape 150. Further, in the shown example embodiment, the illuminator 30 is positioned on the movable foil guiding stage 180, between foil guiding elements 60, to expose the layer of uncured material through the foil 106.

In the embodiment, each time after solidification and separation of a new layer, carrier plate (z-stage) 15 together with the tangible object 5 including solidified layers adhered thereon are moved upwards. Hence, the method for layerwise production of a tangible object is a cyclic method, wherein the described steps of positioning, solidifying, and separating together are comprised in a single cycle step of the method.

In the shown example, the foil 6 is transparent to radiation from illuminator 30. Movable z-stage 140 can be moved in a z-direction before a new layer of curable material is provided to the tangible object 150.

The foil 106 can be arranged for carrying the curable layer material 10 supplied from a dispenser (not shown) to the tangible object 150 and for carrying the removed uncured material away from the tangible object 150.

In one embodiment, for each layer two process steps are always required providing a layer of resin on foil 106, exposure of the resin; in many applications there is also releasing the unexposed resin from the building surface ('peeling' in the example of the drawing).

The system 120 can be provided with vibration damping 200 and a protective cap. A controller can be arranged to control the method steps carried out by the system 120.

Although illustrative embodiments of the present invention have been described with reference to the accompanying drawings, it is to be understood that the invention is not limited to these embodiments. While certain embodiments detail certain optional features as further aspects of the invention, the description is meant to encompass and specifically disclose all combinations of these features unless specifically indicated otherwise or physically impossible. Various changes or modifications may be effected by one skilled in the art without departing from the scope or the spirit of the invention as defined in the claims.

The invention claimed is:

1. An illumination system for use in a stereolithography apparatus, comprising:
 a planar support supporting a two-dimensional array of individually controllable wide-angle light-emitting diodes (LEDs); and
 a multilens projector array arranged relative to the array, and adapted to project a focused image of each LED onto a work area;
 wherein for providing said image of each LED said multilens projector array has an edge area focus error which is smaller than a central area focus error.

2. The illumination system according to claim 1, wherein the central area focus error is more than 25 micron; and wherein the edge area focus error is less than 25 micron.

3. The illumination system according to claim 1, wherein the multilens projector array comprises an array of lenslets aligned with the array of LEDs; the multilens projector array further comprising an optical mask, disposed in between the LEDs and the work area, and having transparent parts that are arranged in correspondence with an arrangement of the LEDs in the two-dimensional array, the transparent parts defining an aperture stop allowing entry of light emitted from angles larger than a maximum entry angle of an outermost ray entering the projector array that can be imaged in focus.

4. The illumination system according to claim 1, wherein the lenslet numerical aperture is larger than 0.3.

5. The illumination system according to claim 1, wherein the multilens projector array comprises a stack of optical elements, including a plurality of lenslets in direct abutment on a lenslet convex side with another optical element in the stack.

6. The illumination system according to claim 5, wherein the plurality of lenslets is formed as a plano-convex multilenslet body; wherein at least one convex side of the multilenslet body is in direct abutment on contact zones arranged over substantially the entire body surface with the another optical element in the stack.

7. The illumination system according to claim 5, wherein the another optical element in the stack is formed by a plano or by another lenslet bodies arranged with opposed convex sides in direct abutment with the convex side of the multilenslet body.

8. The illumination system according to claim 7, wherein the projector body is in direct abutment on contact zones arranged over substantially the entire surface with the support.

9. The illumination system according to claim 3, wherein the optical mask is deposited onto a plano side of the lenslet body, for example by means of vapour deposition.

10. The illumination system according to claim 3, wherein the optical mask is a separate plate-like object.

11. The illumination system according to claim 10, wherein the projector system comprises:
a first multi-lens array;
a second multi-lens array, and
wherein the optical mask is disposed in between the first and second multi-lens arrays.

12. An illumination system according to claim 1, wherein the LEDs are arranged in equidistant and perpendicular rows and columns.

13. An illumination system according to claim 1, wherein a two dimensional array of individually controllable light-emitting diodes (LEDs) is arranged between the planar support and the multilens projector, and wherein the multilens projector array is mechanically supported on the planar support over the array on a plano side, and having a work surface arranged to receive a resin applying device for applying a resin layer on the work surface, the multilens projector array adapted to project light emitted from the LEDs onto the resin layer, and wherein the planar support and the plano side are supported on contact zones arranged over substantially the entire plano side; the illumination system thus forming a rigid body.

14. The illumination system according to claim 13, wherein the contact zones are provided as a plurality of protrusions, integrally cast in the planar support.

15. The illumination system according to claim 13, wherein the contact zones are provided by the LEDs.

16. The illumination system according to claim 13, wherein the contact zones are provided by the LEDs, wherein the contact zones are provided by a perforated plate structure.

17. The illumination system according to claim 13, wherein the contact zones formed by a transparent resin layer immersing the LEDs.

18. The illumination system according to claim 5, wherein said lenslets in direct abutment comprise a flattened portion for increasing geometrical stability.

* * * * *